United States Patent [19]

Gerber et al.

[11] Patent Number: 5,401,913
[45] Date of Patent: Mar. 28, 1995

[54] ELECTRICAL INTERCONNECTIONS BETWEEN ADJACENT CIRCUIT BOARD LAYERS OF A MULTI-LAYER CIRCUIT BOARD

[75] Inventors: Joel A. Gerber, Saint Paul; Peter A. Gits, White Bear Lake, both of Minn.

[73] Assignee: Minnesota Mining and Manufacturing Company, Saint Paul, Minn.

[21] Appl. No.: 74,113

[22] Filed: Jun. 8, 1993

[51] Int. Cl.⁶ .................................................. H05K 1/11
[52] U.S. Cl. ................................. 174/264; 174/263; 174/262; 361/778; 361/795
[58] Field of Search ............... 174/262, 263, 264, 265, 174/250, 259; 361/778, 792, 795

[56] References Cited

U.S. PATENT DOCUMENTS

| | | | |
|---|---|---|---|
| 3,471,631 | 10/1969 | Quintara | 174/264 |
| 3,562,009 | 2/1971 | Cranston et al. | 117/227 |
| 3,646,670 | 3/1972 | Maeda et al. | 29/627 |
| 3,795,047 | 3/1974 | Abolafia et al. | 29/625 |
| 3,835,531 | 9/1974 | Luttmer | 29/625 |
| 3,888,639 | 6/1975 | Hastings et al. | 29/626 |
| 3,913,223 | 10/1975 | Gigoux | 29/625 |
| 3,953,924 | 5/1976 | Zachry et al. | 29/625 |
| 4,157,932 | 6/1979 | Hirata | 156/310 |
| 4,184,729 | 1/1980 | Parks et al. | 339/17 F |
| 4,219,708 | 3/1982 | Lomerson | 228/111 |
| 4,396,457 | 8/1983 | Bakermans | 156/634 |
| 4,466,184 | 8/1984 | Cuneo et al. | 29/830 |
| 4,572,764 | 2/1986 | Fan | 156/630 |
| 4,627,565 | 12/1986 | Lomerson | 228/107 |
| 4,635,073 | 1/1987 | Hanson | 346/1.1 |
| 4,668,332 | 5/1987 | Ohnuki et al. | 156/630 |
| 4,681,654 | 7/1987 | Clementi et al. | 156/630 |
| 4,685,210 | 8/1987 | King et al. | 29/830 |
| 4,692,843 | 9/1987 | Matsumoto et al. | 361/414 |
| 4,788,766 | 12/1988 | Burger et al. | 29/830 |
| 4,803,450 | 2/1989 | Burgess et al. | 333/238 |
| 4,814,040 | 3/1989 | Ozawa | 156/634 |
| 4,818,728 | 4/1989 | Rai et al. | 437/209 |
| 4,824,521 | 4/1989 | Kulkarni et al. | 156/643 |
| 4,854,038 | 8/1989 | Wiley | 29/830 |
| 4,857,482 | 9/1989 | Saito et al. | 437/209 |
| 4,864,722 | 9/1989 | Lazzarini et al. | 29/830 |
| 4,867,839 | 9/1989 | Sato et al. | 156/630 |
| 4,868,350 | 9/1989 | Hoffarth et al. | 174/68.5 |
| 4,887,760 | 12/1989 | Yoshino et al. | 228/56.3 |
| 4,908,940 | 3/1990 | Amano et al. | 29/852 |
| 4,912,020 | 3/1990 | King et al. | 430/311 |
| 4,933,045 | 6/1990 | DiStefano et al. | 156/630 |
| 4,935,584 | 6/1990 | Boggs | 174/262 |
| 4,970,106 | 11/1990 | DiStefano et al. | 428/209 |
| 5,008,997 | 4/1991 | Phy | 29/827 |
| 5,014,162 | 5/1991 | Clark et al. | 361/412 |
| 5,025,553 | 6/1991 | Telco | 29/852 |
| 5,031,308 | 7/1991 | Yamashita et al. | 29/830 |
| 5,034,245 | 7/1991 | Matsubara | 427/54.1 |
| 5,046,238 | 9/1991 | Daigle et al. | 29/830 |
| 5,056,216 | 10/1991 | Madou et al. | 29/843 |
| 5,060,844 | 10/1991 | Behun et al. | 228/180.2 |
| 5,129,142 | 7/1992 | Bindra et al. | 29/852 |
| 5,245,135 | 9/1993 | Schreiber et al. | 174/261 |
| 5,329,423 | 6/1994 | Scholz | 361/760 |

Primary Examiner—Leo P. Picard
Assistant Examiner—L. Thomas
Attorney, Agent, or Firm—Gary L. Griswold; Walter N. Kirn; Stephen W. Buckingham

[57] ABSTRACT

A multi-layer circuit board includes electrical interconnections between adjacent circuit board layers of the multi-layer board. A via hole is provided through a circuit board layer. The via hole is filled with a via metal. The via metal is plated with a low melting point metal. An adhesive film is deposited over the circuit board layer. Adjacent layers of the multi-layer circuit board are stacked and aligned together. The layers are laminated under heat and pressure. The low melting point metal provides an electrical interconnection between adjacent layers.

9 Claims, 5 Drawing Sheets

ELECTRICAL INTERCONNECTIONS BETWEEN ADJACENT CIRCUIT BOARD LAYERS OF A MULTI-LAYER CIRCUIT BOARD

BACKGROUND OF THE INVENTION

The present invention relates to multi-layer circuit boards. In particular, the invention relates to improved electrical interconnections for circuit board layers of a multi-layer circuit board, and to a method of making those interconnections.

Multi-layer printed circuit boards are known in the art, and are used to make complex electrical circuits. (As used herein, a circuit board consists of a pattern of conductive traces which are used to interconnect electric components. The conductive traces are bonded to or otherwise incorporated into an insulating substrate which mechanically supports the components. This includes single and double sided boards, multi layer constructions, hybrids, multi-chip modules, chip on board assemblies and the like. The conductive traces may be formed using any number of techniques, for example electroplating, etching, sputtering, mechanical attachment using adhesives and others. The substrate can be flexible or rigid and can be fabricated of any suitable material, for example polymers, ceramics, glasses, silicon etc.) Electrical connections between components of the electrical circuits are provided on the circuit board layers of the multi-layer circuit board. Using multiple circuit board layers allows the circuit designer to lay out complex circuit designs using many components in which those components require numerous interconnections. Multi-layer circuit boards increase component density and functionality per unit volume.

Each circuit board layer of a multi-layer circuit board carries electrical connections, or electrical traces, which act as wires and are used to interconnect the various components of the circuit. Electrical connection between adjacent circuit board layers is achieved using "vias." A via is created by forming a hole between adjacent layers. The hole is filled with conductive material to form an electrical connection between the two adjacent layers.

Typically in printed circuit board (PCB) fabrication (otherwise known as printed wiring board or plated through hole technology), the electrical traces are formed separately on each layer of the multi layer circuit board. The circuit board layers of the multi-layer circuit board are then stacked and aligned to each other with an electrically insulating bonding layer between adjacent layers. The assembled layers are then subjected to heat and pressure to provide a bond between adjacent layers. Via holes are then drilled in the appropriate locations which interconnect pads on successive layers. The electrical interconnect is achieved by applying a conductive material to the side walls of the via holes. The prior art requires the metal via contact pads to have sufficient area on the circuit board to accommodate the drill cross section and/or any misalignment. These large pad areas limit the component density of the circuit board. To form buried vias additional processing is required. Namely, the above structure is treated as a sub-assembly several of which can be laminated together to form the full board.

The advent of semiconductor processing and advanced materials has permitted the fabrication of circuit boards on a much finer scale than the printed circuit boards described above. Examples of these include hybrids, multi-chip modules (MCMs) and the like. Typically, MCMs are manufactured in small numbers of aerospace, military and supercomputer applications. An example would be MCM-Ds. The D refers to deposition where a circuit is built up upon an inorganic non-conducting substrate using thin film approaches with copper or aluminum traces and organic or inorganic dielectrics. Using these technologies a multi layer circuit is built up by a sequential process. This technology is capable of fabricating very fine lines and vias (blind, stacked, and buried) resulting in very much higher circuit densities than traditional plated through hole technology described above. However, this increased density comes at the cost of much more expensive processing which is usually accomplished in sequential batch processing. Batch processing does not lend itself to high volume production and the sequential fabrication results in lower yield as the deposition of one defective layer ruins an entire part.

U.S. Pat. No. 5,046,238 issued Sep. 10, 1991 to Daigle et al. entitled METHOD OF MANUFACTURING A MULTILAYER CIRCUIT BOARD describes a method for providing interconnections between layers of a multi-layer circuit board and is hereby incorporated by reference. The technology is practiced using fluoropolymers which are expensive and are traditionally difficult to process. Processing difficulties include adhesion problems and the requirement of high temperatures for processing laminates (700° F. and above). In addition, the process is practiced in batch form which is not easily amendable to high volume production.

SUMMARY OF THE INVENTION

The present invention provides an improved process for assembling a multi-layer circuit board with an improved wiring density. The invention provides an improved method of forming interconnections between adjacent layers in a multi-layer circuit board where stacked, buried and blind vias which occupy areas smaller than those occupied by plated through hole technology can be fabricated routinely. The invention does not rely on high cost low volume fabrication methods such as is common in the fabrication of MCMs. In addition, a parallel process for assembling a multi-layer circuit board that reduces the number of manufacturing sequences and increases the yield of completed parts in comparison to sequential processing is provided. Each circuit board layer is fabricated separately allowing inspection of each layer prior to incorporation in the final part.

In one embodiment of the invention, a circuit board layer is formed by depositing electrically conductive material which forms electrical circuit traces as well as interconnect pads on one side of an electrically insulating material. The electrically conductive traces are then exposed on the uncircuitized side of the circuit board layer by forming holes in the electrically insulating material at locations where a via is desired.

The interconnection is fabricated by the formation of rigid bumps of a conductive material in the holes formed in the electrically insulating material which protrude above the surface of the electrically insulating material. An electrically conducting metal which is capable of forming an electrically sound metal to metal bond between the bump and the corresponding pad on an adjacent layer is then deposited on the surface of the bumps or the pads, more frequently on both.

In accordance with another aspect of the invention, a layer of electrically insulating bonding material is deposited over at least one of the surfaces of the circuit board layer fabricated as described above. A plurality of these layers are then aligned and fused together by the application of heat and pressure in a single lamination step to form a multi-layer circuit board. The metal on the surfaces of the bumps bonds with the metal on the pads providing the electrical interconnect between layers and the insulating bonding material forms the mechanical bond that holds the layers together and isolates the via connections.

The above fabrication method can be carried out in a batch process, a continuous process or in a combination of the two. Fabrication using a continuous process enables large volume production of the circuit board layers a clear advantage over the batch type process practiced in both PCB and MCM manufacturing. The ability to perform the majority of the fabrication in a continuous process is an important aspect of this invention.

In another embodiment, the circuit board layers are fabricated in the method described above and laminated under heat and pressure as described above however, the insulating bonding material is substituted with an anisotropically conductive adhesive which by design is an electrical insulator in the plane of the circuit layer but permits electrical conduction in the out of plane direction.

DETAILED DESCRIPTION OF THE PREFERRED EMBODIMENTS

FIGS. 1 through 11 are cross sectional views. For clarity, cross hatching has been omitted.

Figure 1:
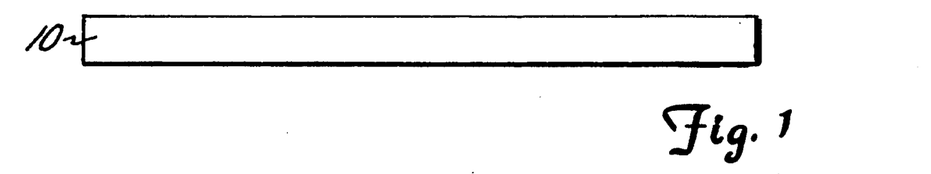
FIG. 1 is a side cross sectional view of a dielectric film circuit board layer.
Figure 2:
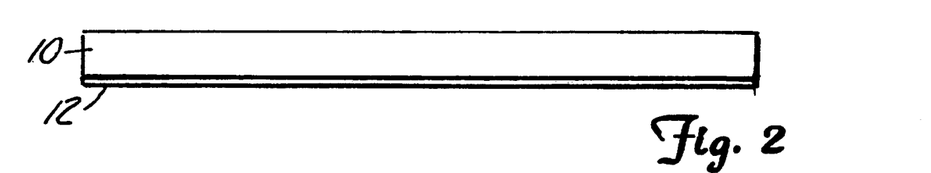
FIG. 2 is a side cross sectional view of the circuit board layer of FIG. 1 including an adhesion and seed metal layer.

FIG. 1 shows a cross-sectional view of a circuit board layer 10. In a preferred embodiment, circuit board layer 10 comprises a precast polymeric dielectric film. The particular dielectric film used is a matter of choice however, web polyimide is an example of one that works well. As shown in FIG. 2, a conductive metal layer, and an adhesion layer is deposited if needed, on the first side of circuit layer 10. The adhesion layer helps bond the metal layer to the dielectric film. The composition of the adhesive layer is a matter of choice depending on the metal and dielectric materials used. The outer metal layer portion of layer 12 can be comprised of copper or other appropriate conductive metal and can be deposited by any appropriate method. Electrodeposition is one process that works well. The resulting metal layer 12 acts as a seed layer for later deposition.

Figure 3:
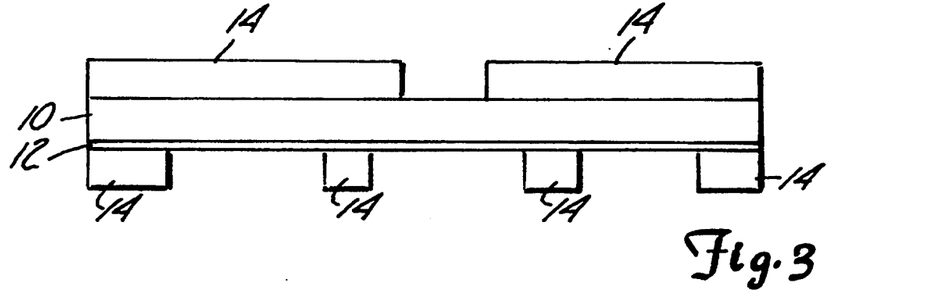
FIG. 3 is a side cross sectional view of the circuit board layer of FIG. 2 including patterned photoresists.

Next, photoresist 14 is deposited, as shown in FIG. 3. Photoresist 14 is a standard photoresist deposited on circuit board 10 using conventional techniques. The photoresist is exposed to radiation through a mask. The photoresist is then developed, which causes portions of the photoresist to be removed exposing material and forming a patterned layer 14 as shown in FIG. 3.

Figure 4:
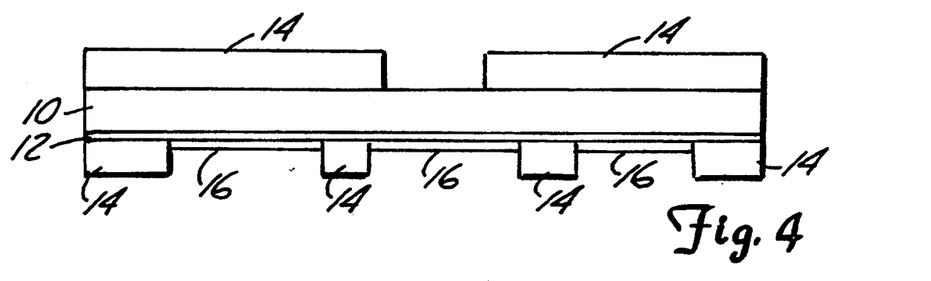
FIG. 4 is a side cross sectional view of the circuit board layer of FIG. 3 including a layer of trace metal.

After photoresist layer 14 has been patterned, a trace metal layer 16 is deposited on the exposed adhesion and conductive metal layer 12 as shown in FIG. 4. In a preferred embodiment, trace metal layer 16 comprises copper and is deposited through electrodeposition techniques so that it is only formed on the exposed portions of layer 12. Trace metal layer 16 forms an electrical circuit carried on circuit board layer 10. Trace metal layer 16 provides the electrical traces which will interconnect components when they are placed in the completed multi-layer circuit board. Additionally, the trace metal provides electrical "pads" which are used to interconnect adjacent circuit board layers. The above discussion of circuitization of the dielectric illustrates one method of depositing circuit traces on the dielectric however, other methods can be used to deposit the circuit traces on the dielectric without changing the invention, for example both additive and subtractive process including sputtering, electroless plating, dry etching and the like.

Figure 5:
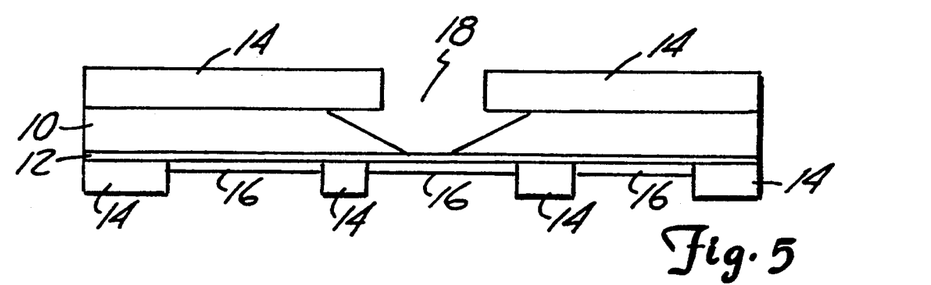
FIG. 5 is a side cross sectional view of the circuit board layer of FIG. 4 including a via hole extending through the circuit board.

Next, a via hole 18 is formed in circuit board layer 10 as shown in FIG. 5. In a preferred embodiment, via hole 18 is formed using a wet milling technique. This may include application of a hot fluid etch such as potassium hydroxide. Photoresist layer 14 and trace metal layer 16 protect portions of circuit board layer 10. The wet milling is of sufficient duration to ensure that via hole 18 extends all the way through circuit board layer 10 to layer 12.

The invention described in the above paragraphs eliminates the necessity of using the annular ring characteristic of plated through hole technology and thus allows for increased circuit density. In other embodiments, the via holes can be formed using any applicable wet or dry milling process. Examples of dry milling processes include laser ablation, ion milling, reactive ion etching, mechanical punching and the like, some of which provide for the formation of holes that are much smaller than those produced by mechanical drilling. This yields even smaller vias and a further increase in circuit density.

Figure 6:
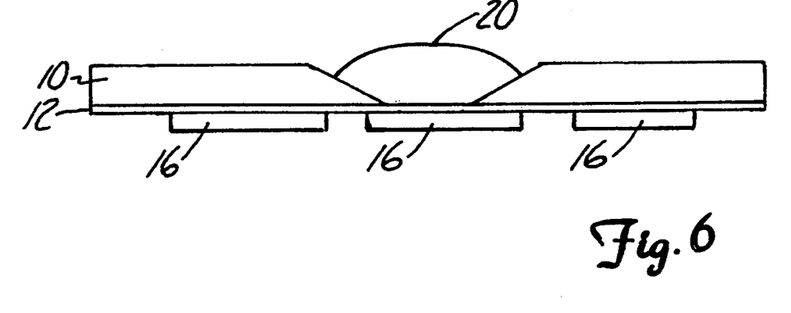
FIG. 6 is a side cross sectional view of the circuit board layer of FIG. 5 following removal of the photoresist and plating of a solid via.
Figure 7:
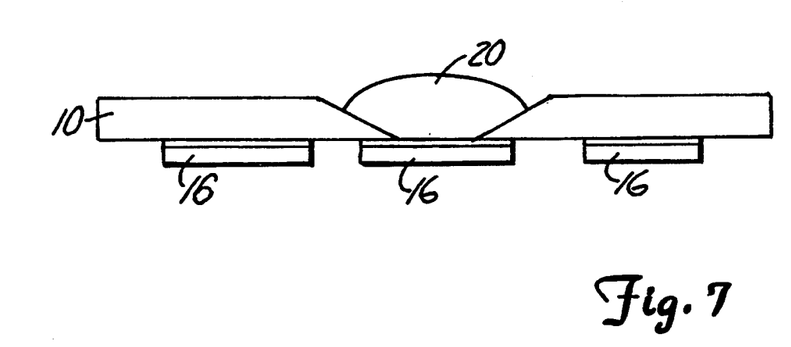
FIG. 7 is a side cross sectional view of the circuit board layer of FIG. 6 following removal of the adhesion and seed metal layer.
Figure 8:
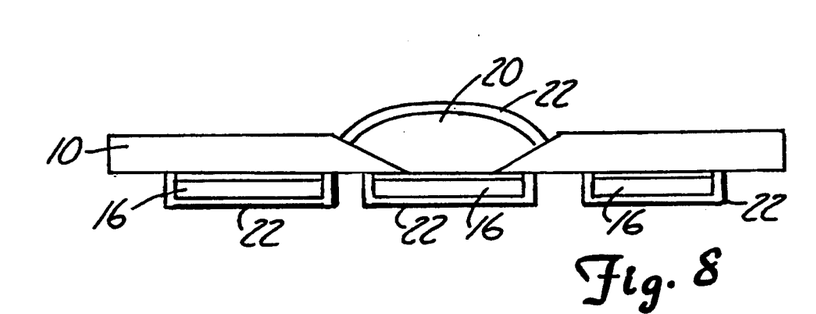
FIG. 8 is a side cross sectional view of the circuit board layer of FIG. 7 following deposition of a cover metal layer.

Once the via holes have been formed, photoresist layer 14 carried on both sides of circuit board 10 is stripped, and circuit board 10 is plated with via metal 20, as shown in FIG. 6. Via metal 20 can be deposited separately or simultaneously with trace metal layer 16 on the opposite side. Via metal 20 electrically contacts trace metal layer 16 through layer 12 and forms a "bump" or "crown" that extends above the top surface of circuit board 10. This bump is used to electrically interconnect adjacent circuit board layers in accordance with the present invention. Via metal 20 should have good electrical conductivity and a high melting temperature relative to a solder. Preferably via metal 20 melts at a temperature greater than 500°C. The trace metal layer 16 forms electrical "pads" which contact the via metal bumps of adjacent circuit board layers. The adhesion and seed metal layer 12 is etched and removed from the circuit side of circuit board layer 10. This removes a small portion of trace metal layer 16. This is shown in the cross sectional view of FIG. 7.

Figure 9:
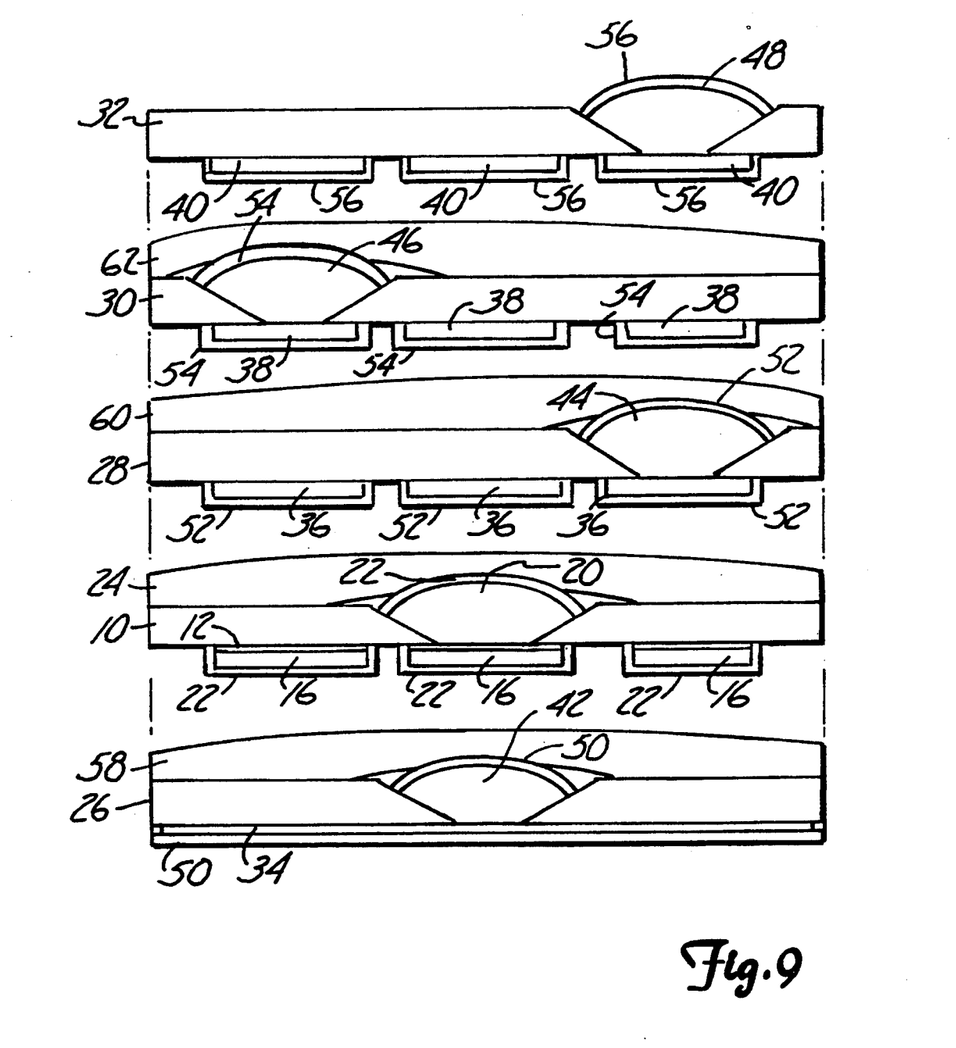
FIG. 9 is a side cross sectional view of the circuit board layer of FIG. 8 including an adhesive film and a plurality of spaced apart circuit board layers.

Next, a second metal layer 22 is deposited on via metal 20 and on the trace metal layer 16 as shown in FIG. 9. In one embodiment, the second cover metal layer 22 is composed of a low melting point metal (low relative to the other metal layers) which is used to fuse with the pad on the adjacent circuit board layer to form electrically stable interconnections between layers. The bump and pads can have the same or different metallurgies and the quantity of metal must be sufficient to provide a stable electrical bond but not so much that reflow causes shorting with adjacent interconnections. Suitable metals for this cover layer include tin-lead, solder, tin, gold-tin alloys or other metals. Layer 22 can be deposited by electroplating, electroless plating, spraying or other process. Tin deposited on both the bump and the pad by an electroless process is one example of a metallurgy that works well. The melting temperature of the cover metal layer has an upper limit which cannot exceed the degradation temperature of the polymeric film, layer 10, or the adhesive layers 58, 24, 60, and 62. While it is desirable in this embodiment to have reflow of the interfacial metallurgy, it is not necessary that the metals melt. Other embodiments include bonding using other means for example cold welding, ultrasonic welding, and the like. The interconnect has been made with just a contact bond as well. It is desirable but not compulsory to accomplish all of the fabrication steps discussed above in a continuous web roll to roll process which amendable to high volume low cost production.

FIG. 9 shows circuit board layer 10 including an electrically insulating bonding film 24 placed between adjacent layers. Additionally, FIG. 9 shows circuit board layers 26, 28, 30, and 32 which have been prepared in accordance with the present invention, as set forth above. Circuit board layers 26-32 include trace metal layers 34, 36, 38, and 40, respectively. Via metal 42, 44, 46, and 48 is deposited in via holes of circuit board layers 26, 28, 30, and 32, respectively. Cover metal layers 50, 52, 54, and 56 are deposited on trace metal layers 34, 36, 38, and 40 and via metal 42, 44, 46, and 48 of circuit boards 26, 28, 30, and 32, respectively. As shown in FIG. 9, the present invention is well suited for forming blind and buried vias, as well as stacked vias as shown by vias 44 46, and 42 and 20. The electrically insulating bonding film layers 58, 24, 60, and 62 are deposited on circuit board layers 26, 10, 28, and 30 and separate adjacent circuit board layers. The particular polymer used is a matter of choice although epoxy compounds have been found to work well. While FIG. 9 shows only five layers, it will be understood that the invention allows for lamination of a plurality of circuit board layers to be assembled as shown to form an interconnected structure. It should be noted as well that such an interconnect could be used to attach a single or multiplicity of layers to a rigid substrate. For example, a flex circuit could be attached to a printed circuit board by putting bumps on the flex and pads on the board.

Following completion of the formation of circuit board layers 10, 26, 28, 30, and 32, the circuit board layers are stacked and aligned as shown in FIG. 9. Specifically, the via metal bump layer of one layer is aligned with its corresponding electrical pad on an adjacent layer. The alignment can be performed by any suitable means. Mechanical alignment using alignment pins is one method that works well.

Figure 10:
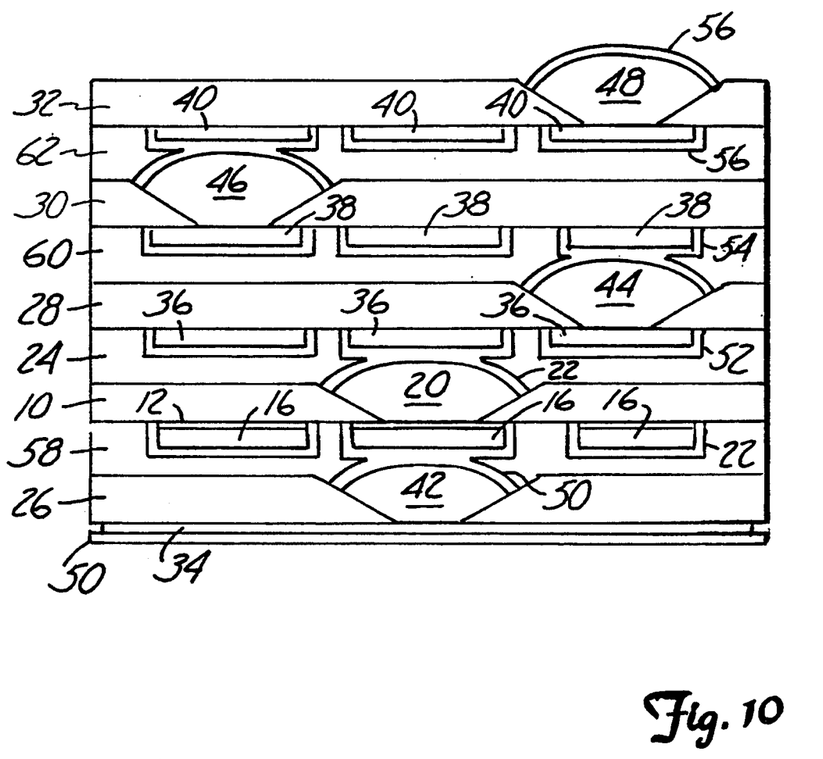
FIG. 10 is a side cross sectional view of the circuit board layers of FIG. 9 following lamination to form a multi-layer circuit board in accordance with the present invention.

Once circuit board layers 10 and 26-32 are aligned as shown in FIG. 9, they are laminated together under heat and pressure to form the structure shown in FIG. 10. The lamination causes an electrical contact where the "bump" of the via metal of one layer contacts an electrical pad of an adjacent layer and the low melting point metal fuses together. Simultaneously, the adhesive layers fuse together forming a mechanical bond that holds the circuit board layers together and isolates the electrical contacts. The lamination conditions are a matter of choice and depend on the polymers and metallurgies involved. Applicable pressure ranges include 0.15 MPa–5 MPa, more preferably 0.3 MPa–3.5 MPa, and more preferably 0.7–1.7 MPa. Temperature ranges for lamination are 80° C.–425° C., more preferable 130°–350° C., and more preferably 175°–280° C. The metal-metal bond is formed instantly and thus the lamination time is dependant on the chosen adhesive bonding material and the temperature at which the bonding takes place.

In another embodiment of the present invention, circuit board layers are fabricated as described above. The bumps and circuitry are then plated with at thin conductive metallurgy for example gold, tin, nickel, palladium and the like. In this embodiment of the invention, the electrically insulating bonding material 58, 24, 60, and 62, used to bond the layers shown in FIG. 9 is an anisotropically conductive adhesive. These adhesives are capable of conducting electricity in one direction while insulating in the other two directions. In this embodiment, there is no direct metallic bonding of the metal pad and bump. Electrical contact is made through a very thin layer of adhesive pressed between a given bump and its corresponding pad. An example of one type of anisotropically conductive adhesive is described in U.S. Pat. No. 5,143,785 issued Sep. 1, 1992 held by 3M. This adhesive is structured such that when the adhesive is compressed under heat and pressure to form a bond, small conductive particles dispersed in the resin are trapped between the bump and the contact pd and are compressed forming electrical contacts between the bump and the contact pad. The adhesive cures trapping the particles in place. No metal reflow is needed for such a bond and thus laminations can be performed at temperatures below the melting point of the interface metallurgy.

Figure 11:
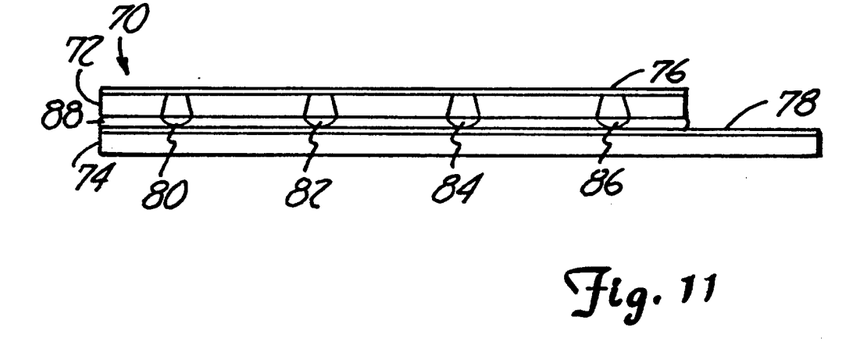
FIG. 11 is a side cross sectional view of a test sample.

FIG. 11 shows a test sample 70 having circuit board layers 72 and 74. Circuit board layer 72 carries copper layer 76 and circuit board layer 74 carries copper layer 78. "Bumps" 80, 82, 84, and 86 extend between copper layer 76 and copper layer 78 and contact copper layer 78 in accordance with the present invention. An insulating dielectric adhesive layer 88 separates circuit board 72 from circuit board 74.

Six samples similar to sample 70 were made. Each sample had a total of 16 "bumps." Electrical resistance measurements were made between copper layer 76 and copper layer 78. All six samples showed a resistance of less than 0.10 Ohms. Circuit boards 72 and 74 were pulled apart so that the individual "bumps" could be examined. As the samples were pulled apart, most of the bumps were transferred to copper layer 78 so that the individual bumps could be tested. Using a four point test probe, each bump had an electrical resistance of less than 0.10 Ohms. Resistance measurements as low as 0.5 milli-Ohms have been observed.

When laminating circuit board layers of the present invention, the edges may be sealed by allowing the adhesive to overlap the edges. This improves the reliability of the electrical interconnections under conditions of high humidity and temperature. Samples fabricated in the manner of these examples have survived humidity aging tests for over 1000 hours at 85° C. and 85% relative humidity.

In another example, many samples fabricated from flexible Kapton polyimide substrate similar to that of FIG. 11 with 4 by 5 inch arrays of bumps with a pitch of 40 mils and bump diameter and heights of less than 200 and 25 μm respectively and a tin cover metallurgy were bonded to a tin plated copper substrate. A high performance 9900 epoxy adhesive film available from Minnesota Mining and Manufacturing Company of Saint Paul, Minn. was used as the bonding adhesive Laminations were executed at 450° F. and 500 Psi for 30 minutes. Individual vias were isolated by etching the surrounding copper after bonding and single via resistances of less than 10 milli-Ohms were measured. Examination of sectioned samples using optical and scanning electron microscopy revealed reflow of the tin at the bump-pad interface indicating good electrical contact. Samples with a plurality of such layers have been fabricated as well.

The present invention provides an improved electrical interconnection between adjacent circuit board layers in a multi-layer circuit board. The fabrication process for the circuit layers of the present invention is based on the enhancement of the processing of fine pitched metallized circuit layers which are already produced in high volume for use in TAB and flex circuitry. The lamination technology used to assemble the circuit boards of the current invention is based on the enhancement of conventional high volume printed circuit board production. The invention includes a simple improved method of electrical interconnection which allows the combining of these two well developed technologies to produce a circuit board that has interconnect densities in the range of high density circuits but is manufactured using conventional techniques and materials at significantly lower cost. Since all of the circuitry is fabricated prior to lamination, each circuit layer can be inspected prior to lamination into the full multi-layer structure thereby increasing yield. Furthermore, fabricating the circuit board in a single lamination step, so called parallel processing, results in significant cost savings over the prior art. The invention provides for a via formation process that yields vias which are much smaller than the prior PCB art and can be buried, blind and stacked without additional processing. The smaller vias provide for the resulting increase in circuit density achieved using the current invention. The invention also provides for a substrate with some inherent flexibility. The present invention can be employed with a wide range of dielectric films which are used to form individual circuit board layers. Although a description of a "bump" contacting an electrical pad has been shown, the present invention can also be used where a "bump" contacts another "bump."

Although the present invention has been described with reference to preferred embodiments, workers skilled in the art will recognize that changes may be made in form and detail without departing from the spirit and scope of the invention. For example via holes can be formed by any wet or dry process such as laser ablation, reactive ion etching, mechanical punching, photo imaging, chemical milling, mechanical forming, casting etc. Different adhesives and dielectrics than those described can be used. The adhesive layer can be removed altogether replacing the dielectric substrate film with a conformable film that bonds to the adjacent layers. For example, conformable polyamide and the like. The present invention can be used in forming multi-chip modules, tape automated bonding of double metal (ground plane) tape, and other microelectronic interconnect devices.

What is claimed is:

1. A multi-layer interconnect, comprising:
   a first circuit board layer having a first side and a second side, the first circuit board layer including a via hole extending through the first circuit board layer from the first side to the second side;
   a trace metal layer deposited on the first side of the first circuit board layer;
   conductive via metal carried in the via hole of the first circuit board layer, the conductive via material in electrical contact with the trace metal and forming a crown exterior to the via hole on the second side of the first circuit board layer;
   a second circuit board layer having a first side;
   an adhesive between the first side of the first circuit board layer and the first side of the second circuit board layer; and
   an electrical contact on the first side of the second circuit board layer, the electrical contact generally aligned with the via hole and the conductive via material, wherein the conductive via material provides an electrical conduction path between the trace metal and the electrical contact.

2. The multi-layer interconnect of claim 1 wherein a layer of low melting point metal overlies the crown of the via metal.

3. The multi-layer interconnect of claim 2 wherein the low melting point metal comprises immersion tin.

4. The method of claim 1 wherein the low melting point metal layer comprises electroplated tin.

5. The multi-layer interconnect of claim 1 wherein the first and second circuit board layers comprise polymeric film.

6. The multi-layer interconnect of claim 1 wherein the trace metal layer comprises copper.

7. The multi-layer interconnect of claim 1 wherein the conductive via metal includes copper.

8. The multi-layer interconnect of claim 1 wherein a conductive adhesive overlies the crown of the via metal.

9. The multi-layer interconnect of claim 1 including at least a third circuit board layer laminated to the first and second circuit board layers.

* * * * *

UNITED STATES PATENT AND TRADEMARK OFFICE
CERTIFICATE OF CORRECTION

PATENT NO. : 5,401,913
DATED : March 28, 1995
INVENTOR(S) : Joel A. Gerber, Peter A. Gits It is certified that error appears in the above-indentified patent and that said Letters Patent is hereby corrected as shown below:

Page 1, Item [56] U.S. Patent Documents, delete "4,219,708" and insert --4,319,708--.

Column 3, line 18, insert --;-- after the word "layers".

Column 3, line 25, insert --. -- after the word "above".

Column 3, line 25, delete "however," and insert --However,--.

Column 4, line 2, insert --;-- after the word "choice".

Column 4, line 36, insert --;-- after the word "dielectric".

Column 5, line 7, insert ',' after the word "Preferably".

Column 6, line 34, delete "at" and insert --a--therefore.

Column 6, line 51, delete "pd" and insert --pad--therefore.

Column 7, line 26, insert --.-- after the word "adhesive".

Signed and Sealed this

Twenty-eighth Day of October, 1997

Attest:

BRUCE LEHMAN

*Attesting Officer*  *Commissioner of Patents and Trademarks*